United States Patent
Ohanian

(12) 
(10) Patent No.: US 6,253,266 B1
(45) Date of Patent: Jun. 26, 2001

(54) APPARATUS AND METHOD FOR CONTROLLING INFORMATION FLOW IN A CARD CAGE HAVING MULTIPLE BACKPLANES

(75) Inventor: Raffi S. Ohanian, Plano, TX (US)

(73) Assignee: Inet Technologies, Inc., Richardson, TX (US)

(*) Notice: Subject to any disclaimer, the term of this patent is extended or adjusted under 35 U.S.C. 154(b) by 0 days.

(21) Appl. No.: 09/251,898

(22) Filed: Feb. 19, 1999

(51) Int. Cl.[7] .................................................. G06F 13/00
(52) U.S. Cl. ........................ 710/102; 361/796; 361/788; 439/61
(58) Field of Search ..................... 710/102, 100, 710/101; 361/752, 796, 788; 439/61

(56) References Cited

U.S. PATENT DOCUMENTS

| | | | |
|---|---|---|---|
| 4,158,220 | * 6/1979 | Yamamoto et al. | 361/796 |
| 4,417,778 | 11/1983 | Halvosrsen et al. | 339/17 |
| 6,061,504 | * 5/2000 | Tzelnic et al. | 395/200.49 |

FOREIGN PATENT DOCUMENTS

| | | | |
|---|---|---|---|
| 0392 114 A | 10/1990 | (EP) | G06F/13/40 |
| 0688157 A | 12/1995 | (EP) | H05K/7/14 |
| 50-119282 | * 9/1975 | (JP) . | |

OTHER PUBLICATIONS

"IEEE Standard for Metric Equipment Practice for Microcomputers–Convention–Cooled with 2 mm Connectors", Published by The Institute of Electrical and Electronics Engineers, Inc., Jan. 9, 1992, pp. 1–37.

"IEEE Standard for Mechanical Core Specifications for Microcomputers Using IEC 603–2 Connectors", Published by the Institute of Electrical and Electronics Engineers, Inc., Jun. 18, 1992 pp. 1–51.

* cited by examiner

Primary Examiner—Ario Etienne
(74) Attorney, Agent, or Firm—Fulbright & Jaworski L.L.P.

(57) ABSTRACT

A card cage that includes a top plane and a bottom plane and a card for use with the card cage. The card cage may operate in a variety of settings including a redundancy scheme and a load sharing scheme. The top plane and bottom plane, which replace the back plane that appears in a traditional card cage, are able to simultaneously receive a card (or cards). The top plane and bottom plane include connectors which may be coupled with other connectors on the top side and bottom side of the card to secure the card in the card cage.

26 Claims, 4 Drawing Sheets

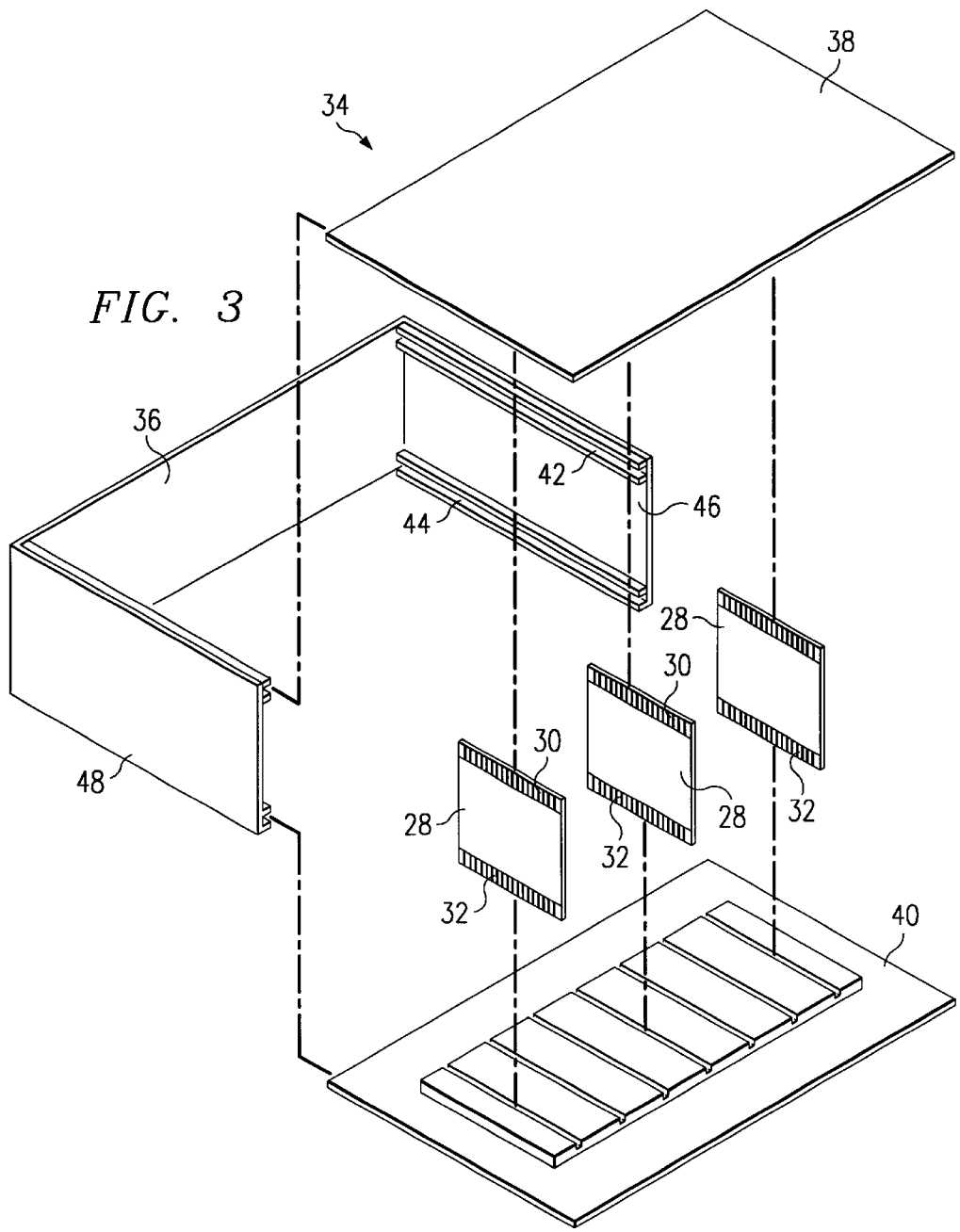
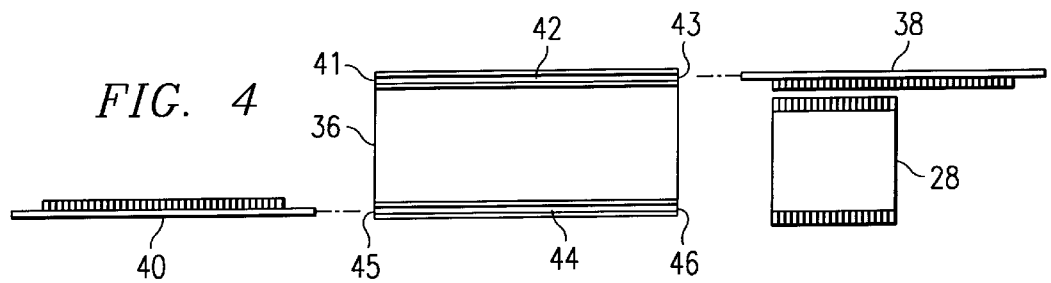

APPARATUS AND METHOD FOR CONTROLLING INFORMATION FLOW IN A CARD CAGE HAVING MULTIPLE BACKPLANES

TECHNICAL FIELD

The present invention is related to circuit card cages and more specifically, to a card cage system that employs a redundancy scheme to allow continuous service to and from circuit cards located in the card cage.

BACKGROUND

A card cage, which is also known as a sub rack, is used to house circuit cards that perform various actions in a communications network. The circuit cards, which are also known as processor modules, boards, circuit boards, printed circuit boards, and plug-in units, contain electronic components (e.g. integrated circuits, resistors, capacitors, etc.) that aid in the processing of a requested action. The card receives a request to process the requested action and, after processing the requested action, sends the results to the communication entity that originated the request. The entity originating the request can be a device exterior to the card cage (e.g. a telephone, a computer, a communications switch, a card in another card cage, etc.) or may be a device in the card cage (e.g. a card or any device such as a processor on a card, etc.).

A typical card cage provides a connection and power to a card via the back-plane of the card cage. Referring to FIG. 1, a prior art card cage system 10, that includes a card cage 12 and a plurality of cards 16, is displayed. When one or more of the cards 16 are placed in the card cage 12, a back portion of the cards 16 referred to as connector 18, is electrically coupled to a portion of the back-plane 14 that is capable of receiving connector 18. This coupling allows for the transfer of signals to and from the card corresponding to the requested action. If the back plane 14 becomes inactive (e.g. by going out of service, when a component on the back plane becomes corrupt, etc.), however, the cards 16 will no longer be able to receive power and thus will be unable to perform their intended functionality. This problem is compounded when many cards are concurrently being utilized or when the cards being utilized perform various functions. In such a situation, services may become unavailable, isolated outages may occur and an entire communications network may be crippled.

To overcome this serious situation in prior art card cages, the back plane 14 must be powered off and then removed. Once a prognosis is made as to the reasons(s) for failure, the back plane 14 is either repaired or replaced and then placed back into the card cage 12. As a result, considerable down time is typically encountered causing an adverse effect on the efficiency and quality of the communications network. Thus, there exists a need for a card cage, card and method of information transfer that overcomes the problems described above.

SUMMARY OF THE INVENTION

These and other objects, features and technical advantages are achieved by a system and method which provide multiple planes of a card cage for receiving circuit cards. In the embodiment disclosed herein, the card cage has a top plane and a bottom plane each with connectors for receiving circuit cards. Alternatively, multiple redundant planes may be placed on any location or combination of locations with the card cage, such as on the back, top, bottom or side walls of the card cage. When a plane is active may provide information, such as power, timing, control and/or signaling data, to the circuit cards that are installed in the card cage and coupled to the plane.

Each active plane is capable of load sharing with the other planes provided in the card cage. Thus, in a preferred embodiment a percentage of information may be provided to cards within the card cage by one active plane and a percentage of information provided to cards within the card cage by another active plane. Alternatively, either plane may be a primary plane that provides all of the information to the cards, while the other card is in a standby condition in case the primary plane fails or is taken out of service.

In a preferred embodiment, each plane is operable in a redundant manner, such that if one plane becomes inactive the other plane(s) that is still active within the card cage effectively takes over for the inactive plane to prevent disruption in the service to the circuit cards. Thus, an inactive plane may be removed, repaired or replaced without disrupting service to cards contained within a card cage because other active plane(s) of the card cage continue servicing the cards.

Additionally, a circuit card is provided having multiple connectors for coupling to the multiple planes of the card cage. A circuit card has a connector on the top of the card and a connector on the bottom of the card, which allow such a circuit card to be received by a card cage having top and bottom planes. Both such connectors are capable of providing an interface for information between the circuit card and dual redundant planes of a card cage. Accordingly, each of the multiple connectors on a circuit card provide a redundant interface for the planes in a card cage.

Furthermore, a computer program may be executing within the system to control the operation of the dual redundant planes of a card cage. Such a program preferably executes to determine whether each plane of the card cage is active or capable of being active. Preferably, the program further executes to control or distribute a percentage of information (or the "load") provided to installed cards from each active plane. Thus, the program preferably executes to control load sharing between the active planes of a card cage. Also, the program executes to control the redundancy of the planes of a card cage to prevent disruption of the service to the installed cards. That is, the program compensates for an inactive plane by distributing information to installed cards via a remaining active plane(s) within the card cage.

The disclosed system further provides for redundancy among the installed cards. Each active card is assigned to perform one or more applications. Preferably, more than one card runs each required application. Spare or redundant cards are also provided in the card cage to assume the functions of any active card that is take out of service, is unable to support the application or fails. Dedicated control cards, which are also installed in the card cage, may additionally monitor the functioning of the planes and the other installed cards and may control which applications are performed by the cards.

It should be appreciated that a technical advantage of the present invention is that a system and method for information transfer is provided wherein load sharing may be performed among multiple planes of a card cage. Accordingly, more efficient operation of such a card cage may be accomplished. Additionally, because each of the multiple planes of a card cage may be sharing a portion of the "load," problems with any one of the multiple planes may be recognized more quickly and such problems may be recognized at opportune times. That is, problems with one plane may be recognized and remedied while other planes are active within the card cage, rather than first determining whether there are any problems with a plane when the system is depending on that plane's operation.

A further technical advantage of the present invention is that a system and method for information transfer is provided wherein redundancy may be available between multiple planes of a card cage. Accordingly, if one plane of a card cage becomes inactive, another plane of the card cage that is active may operate to prevent disruption of service to cards contained within the card cage. As a result, less down time may be recognized for the system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 3 depicts a card cage that displays sliding planes for use with the present invention;

FIG. 4 depicts a side view of a card cage comprising slots to receive the sliding planes for use with the present invention;

DETAILED DESCRIPTION

The present invention discloses a card cage that includes a top plane and a bottom plane and a card for use with the card cage. The card cage may operate in a variety of settings including a redundancy scheme and a load sharing scheme. The top plane and bottom plane, which replace the back plane in a traditional card cage, are able to simultaneously receive a card or cards. The top plane and bottom plane include connectors which may be coupled with other connectors on the top side and bottom side of the card to secure the card in the card cage.

Figure 1:
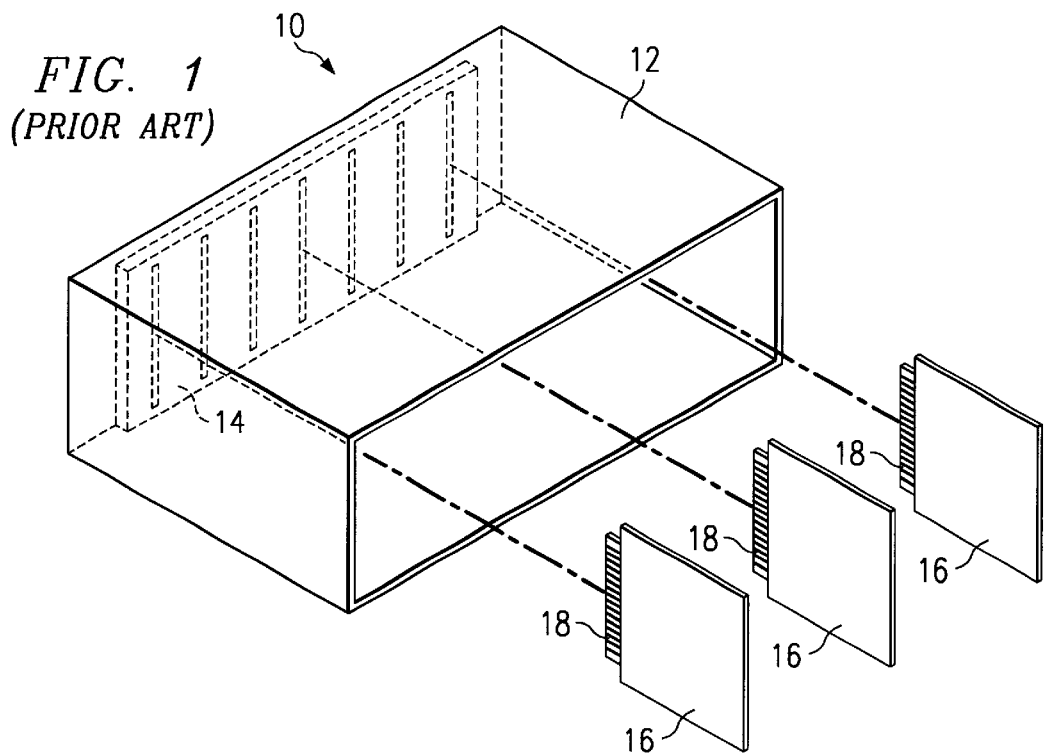
FIG. 1 depicts a prior art card cage system.
Figure 2:
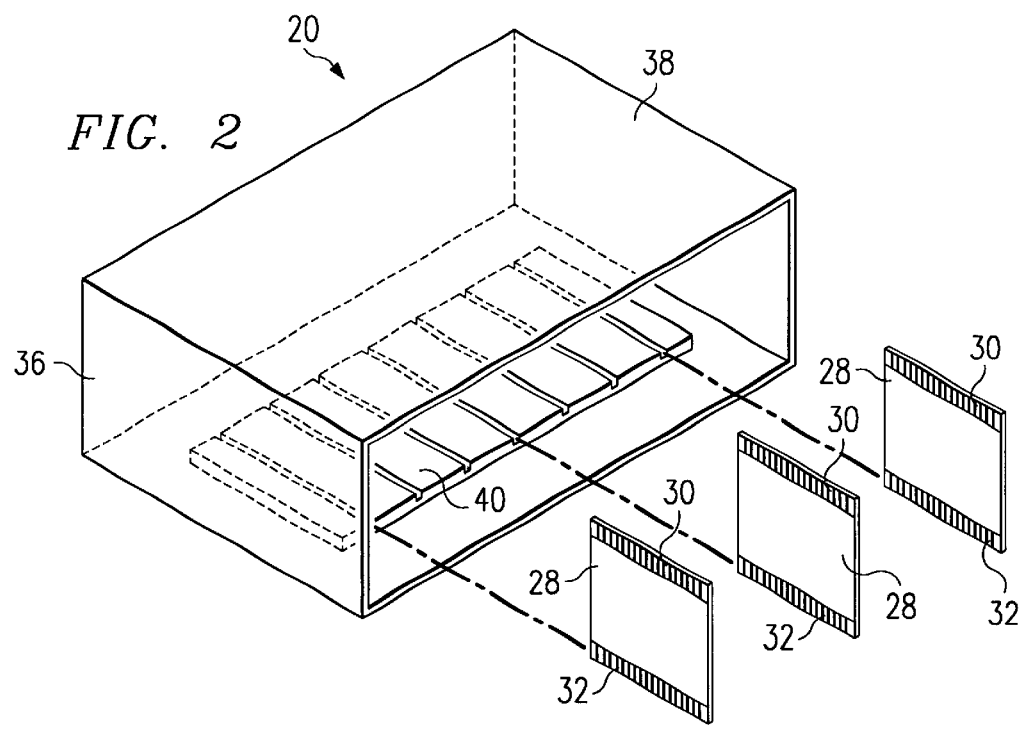
FIG. 2 depicts a card cage system for use with the present invention.

An exemplary embodiment of the card cage and cards is illustrated in FIGS. 2–6. FIG. 2 displays a preferred embodiment of a card cage system 20 that includes a card cage 36 and a plurality of cards 28. The card cage 36 includes a top plane 38 and a bottom plane 40 that form a top portion and a bottom portion of the card cage 36 respectively. Only the bottom plane connectors are illustrated in FIG. 2 in order to simplify the figure. It will be understood that there are card connectors on the top plane (not shown). Each plane can distribute information, such as power, timing, control, and signaling data, to and from the plurality of cards 28 in the card cage 36. To facilitate such a distribution, the cards 28 have at least one connector on the top side 30 and at least one connector on the bottom side 32 that, when cards 28 are placed in the card cage 36, connect to the top plane 38 and the bottom plane 40 respectively. Since the card cage 36 has two planes (instead of the traditional single back plane), it can offer many advantages such as using its planes in a redundant or load sharing manner.

In a redundancy scheme, the top plane and bottom plane work exclusively of one another. In this scenario, one of the planes may be active while the other is inactive. The active plane may provide power, timing, control, and signaling data to be transmitted between the cards and the communications entities (such as telephones, computers, switches, other cards, etc.) and the inactive plane (which could similarly provide power, timing, control, and signaling data) is available if the active plane becomes inactive. If the active plane becomes inactive, the previously inactive plane would become active and allow service to seamlessly continue without disruption to the card cage or the communications network. The active plane that became inactive could then be removed from the card cage (e.g., by disconnecting the appropriate connectors and sliding or lifting the plane out) and either serviced or replaced while the now active plane continues to allow communications between the cards and the various communications entities. In this manner, redundancy capabilities may be offered which allow the cards to continue to process information ensuring the capability and quality of the network. After the plane is serviced or replaced, it may be placed back into the card cage as the inactive plane and may become active if the now-active plane becomes inactive.

It will be understood that the term "inactive" as used in the present disclosure refers to planes or cards that may be out-of-service, broken or inoperable and also to planes or cards that are fully operable but are in a standby condition. Such standby planes are connected to the cards in the card cage and are merely waiting in a ready condition in case the other plane is put out-of-service, is put in a reduced service mode, or is incapable of providing full service to the cards. In one embodiment, the standby plane may provide information to the cards, but the cards may not be using the power or data from the designated standby plane. Such an arrangement would allow the system to quickly and efficiently transfer operation in case the primary or non-standby plane failed or was taken out of service.

In a load sharing scheme, the top plane and bottom plane may simultaneously provide power, timing, control, and signaling data to be received from and provided to the cards. In this manner, each plane may provide a variable percentage of the power, timing, control, and signaling data that is provided to and from the cards. For example, the top plane may perform 80% and the bottom plane may perform 20% of the power, timing, control, and signaling. The percentages may be pre-set and may be altered at any time. Additionally, if one of the planes becomes inactive, the still-active plane may perform at 100%, thereby ensuring continuous service. Alternatively, one plane may provide all of one function or service, such as power and timing, and the other plane may provide all of the remaining functions or services, such as carrying control and signaling data.

FIG. 3 displays a preferred embodiment of the card cage system 34 in which top plane 38 can be slid out of or into a slot 42 in a top portion 46 and a bottom plane 40 can be slid out of or into a slot 44 in a bottom portion 48. If one of the planes 38 or 40 became inactive, the inactive plane may be removed by disconnecting it from connected cards 28 and sliding the now-inactive plane out of the slot in which it was contained. Because the cards 28 are still connected to the other plane (which was inactive, but is now active), such cards are still able to function correctly and efficiently. This redundancy capability offers a tremendous advantage over prior art designs in that power, timing, control, and signaling data are still able to be distributed to the cards and an inactive plane can be quickly removed and replaced without any loss of service. The top plane 38 and the bottom plane 40 are shown with partially dotted lines to indicate that they are sitting in a retracted position within their respective slots 42 and 44 which are shown in greater detail with reference to FIG. 4.

FIG. 4 displays a side view of the card cage 36 described in FIG. 3. The top plane 38 and the bottom plane 40 may be, respectively, placed in and secured to the top slot 42 and the bottom slot 44 in any known manner (e.g. through the use of connectors, locking hooks, studs and fasteners, etc.). Additionally, in a preferred embodiment the top plane 38 and the bottom plane 40 may be, respectively, placed in and removed from slot 42 and slot 44 via the front portion and the back portion of the card cage 36. For example, the top plane 38, as shown, may be placed in and removed from the front portion 43 of the slot 42 while the bottom plane 40, as shown, may be placed in and removed from the back portion 45 of the slot 44.

In an alternative embodiment, top plane 38 and bottom plane 40 may be placed in and removed from the back portion 41 of the slot 42 and the front portion 46 of the slot 44 respectively. In other alternative embodiments, both top plane 38 and bottom plane 40 may be placed in and removed from the front portions of slots 42 and 44, or both top plane 38 and bottom plane 40 may be placed in and removed from the back portions 41, 45 of slots 42 and 44. Additionally, since the top plane 38 and the bottom plane 40 provide redundancy to the card cage 36, the planes may be identical and could be used in either slot 42 or 44.

Figure 5:
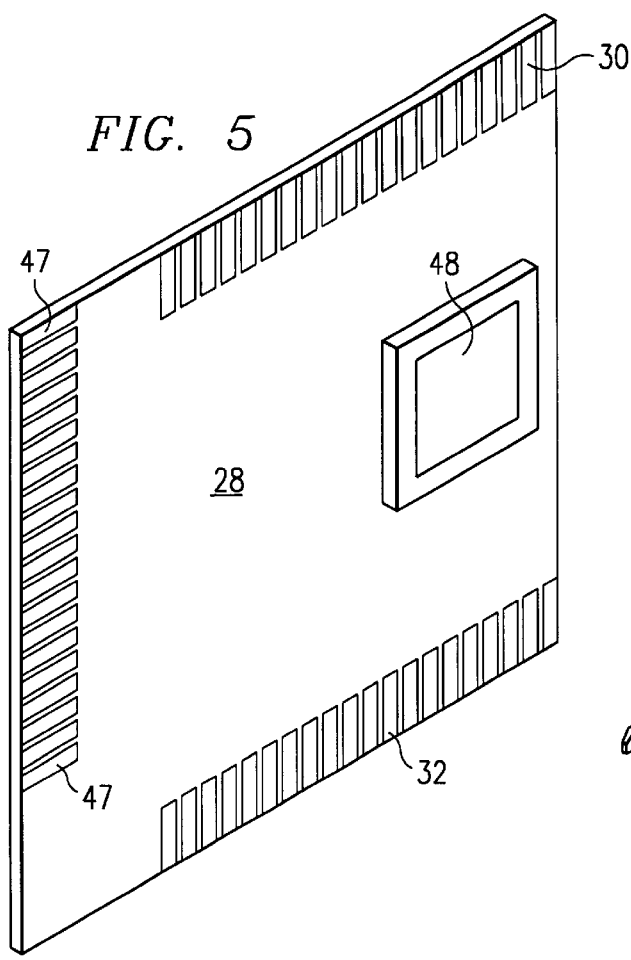
FIG. 5 depicts an exemplary card for use with the present invention.

FIG. 5 displays a preferred embodiment for one of the cards 28 that has at least one connector on the top side 30 and at least one connector on the bottom side 32. Additionally, the card 28 may include at least one additional connector on the back side 47 that may accommodate other hardware, such as a Line Interface Unit (LIU) which will be described in reference to FIGS. 6, 7, and 8. The cards 28 are controlled by a processor which may be, for example, a microprocessor, an Application Specific Integrated Circuit (ASIC), or a Digital Signal Processor (DSP). Further, the card 28 may include at least one disk drive 48 that can be used to store or retrieve certain information, such as operating instructions, responses to various actions, network statistics, and the like.

In a preferred embodiment of the card cage 36, eighteen physical slots are available to house up to eighteen cards. Certain slots may be reserved for special cards that have predetermined functions, such as special hardware control responsibilities. These slots may be positioned at any location in the card cage, for example in the first two slots or in any other card slots. The designated control cards provide redundancy control by detecting failure of any card or plane. When a plane failure is detected, the control cards may direct the other cards to switch to the redundant plane if necessary and also to activate the redundant plane. The control cards may also try to reset failed cards or planes in an attempt to bring the failed device back in service. In another embodiment, processors on the other installed cards may perform all of, or a portion of, the functionality of the control cards. Alternatively, a remote device may monitor and control the plane functionality.

Of the remaining non-control slots, the majority are typically used for cards that handle various applications, such as routing and translation capabilities. Preferably, each application is assigned to at least two cards so that the system maintains a high degree of redundancy and eliminates or reduces the possibility of single points of failure. Additional protection is provided by assigning redundant cards to certain slots. These redundant cards may be assigned to take over the applications for cards or slots that have failed during operation. For example, if one of the cards 28 becomes inactive, one of the redundancy cards can be utilized to provide the needed resources for the application(s) that the now-inactive card was supplying. The inactive card may then be disconnected from the planes 38 and 40 and then replaced. As previously described, the control cards monitor the operation of the applications cards and direct the redundant cards to take over the applications from failed cards that cannot be reset.

Figure 6:
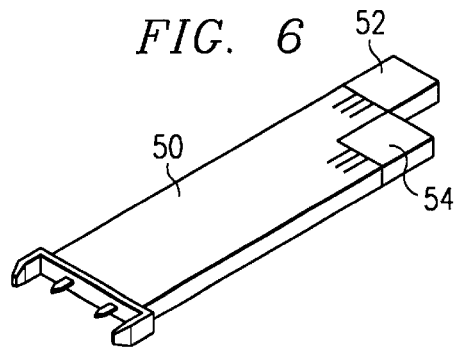
FIG. 6 depicts a line interface unit for use with the present invention.

FIG. 6 displays a line interface unit (LIU) 50 that may be utilized in a preferred embodiment of the present invention. The card cage 36 provides access to physical signaling interfaces via the LIUs. Prior art systems have used a single LIU board with a plurality of LIU slots to support the physical interfaces. If one of the LIU slots were to become inactive, the entire LIU board would have to be removed to attempt to reactivate or replace the LIU. Such action would cause tremendous degradation in the network. In the preferred embodiment of the present invention, however, each LIU 50 is a separate physical board that supports one physical interface. Since each LIU is a physically separate component, the replacement of an LIU may be done quickly without impacting the ongoing operation of the card cage 36.

Figure 7:
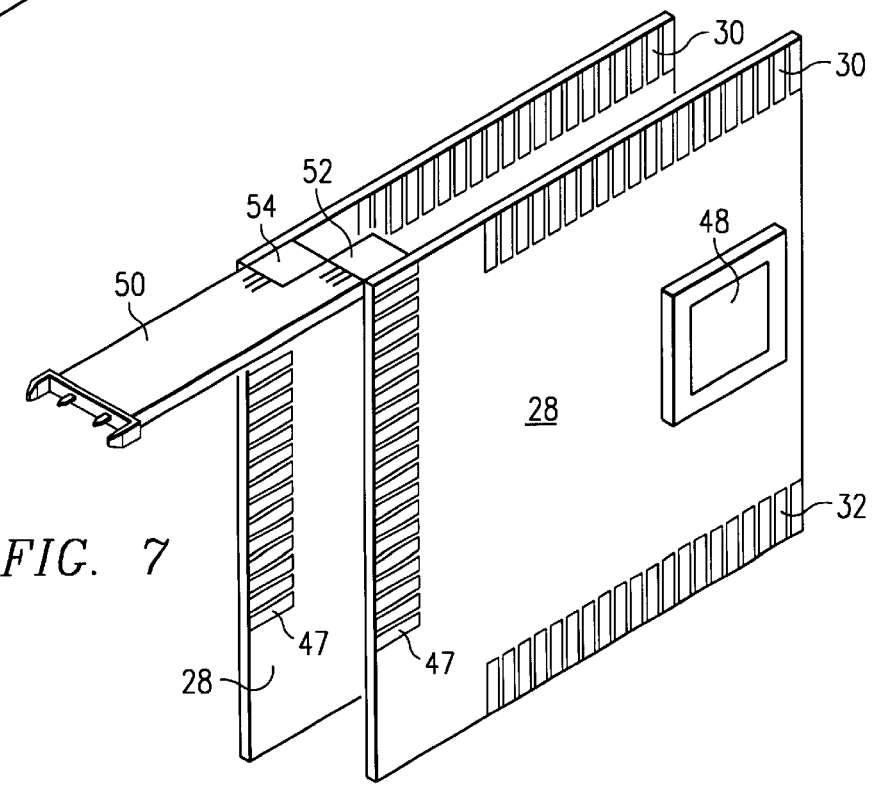
FIG. 7 depicts a set of cards coupled with the line interface unit.

FIG. 7 displays the LIU 50 connecting two cards 30 by sliding the LIU through a set of the connectors 47 found on the back side of the cards. In a preferred embodiment, the LIU is slidably attached to and can be slidably removed from, the back portion of the card cage 36 in a horizontal position between two of the cards 28. In one embodiment up to 16 LIUs can be inserted between any two cards. For example, a card cage with 16 application cards will be able to hold up to 256 LIUs (16 cards×16 LIUs) in this embodiment. Other configurations of LIUs may be used and the number of LIUs for each card may vary. The LIUs may provide full duplex receive and transmit, and synch and asynch capabilities for various interfaces such as, V.35, DS0-A (Bellcore), and E1. Though the exemplary card cage can house 18 cards, a number of slots as previously described, may be reserved for redundancy operations and fault correction. The redundancy operation of the cards will be further described in conjunction with FIG. 8.

Input/output (I/O) cards (not shown) may be used to connect the cards 28 to other equipment, such as cards, switches, or other communications devices in the network. Each I/O card may plug vertically into the back of the card cage 36 in a slot (not shown) corresponding to a card and may provide, for example, an Ethernet 10/100 Mbit interface, a Small Computer System Interface (SCSI), a Firewire interface, or a Intelligent Drive Electronics or Integrated Drive Electronics (IDE) interface.

The Ethernet 10/100 Mbit interface may support data transfer rates of up to 10 Mbps or up to 100 Mbps between the card cage and various hosts or segments within the network. A host may be a computer that is connected to a TCP/IP network, such as the Internet, while a segment may be a section of a network that is bounded by bridges, routers, hubs, or switches. Additionally, Gigabit Ethernet (which supports data transfer rates of 1000 Mbps) may also be utilized. Ethernet standards (such as IEEE 802.3) are well known to those of ordinary skill in the art and thus will not be described further.

A SCSI is a parallel interface for attaching peripheral devices such as disk drives to the card cage. SCSI interfaces provide for faster data transmission rates (up to 80 megabytes per second) than standard serial and parallel ports. In addition, many devices may be attached to a single SCSI port, so that SCSI is really an I/O bus rather than simply an interface. SCSI is an ANSI standard and there are many variations of it that are well known to those of ordinary skill in the art and thus will not be described further.

A Firewire interface is a very fast bus standard that supports data transfer rates of up to 400 Mbps. A single Firewire port can be used to connect up to 63 external devices. In addition to its high speed, the Firewire interface also supports isochronous data which delivers data at a guaranteed rate. This makes it ideal for a preferred embodiment of the card cage which may transfer high levels of data in real-time. Firewire standards (such as IEEE 1394) are well known to those of ordinary skill in the art and thus will not be described further.

The IDE interface is an interface for mass storage devices, such as the disk drive 48, in which the controller is integrated into the disk (or, for example, a CD-ROM) drive. The IDE interface is well known to those of ordinary skill in the art and thus will not be described further.

In a preferred embodiment, a plurality of card cages may be "stacked" and interconnected to provide additional processing capabilities. The Firewire, which runs vertically between each card, may be used to provide interconnection and to facilitate the transfer of information between the cards in a card cage and between cards in each of the other card cages. Additionally, the top plane 38 and the bottom plane 40 may distribute power, timing, control, and signaling data to the cards.

Figure 8:
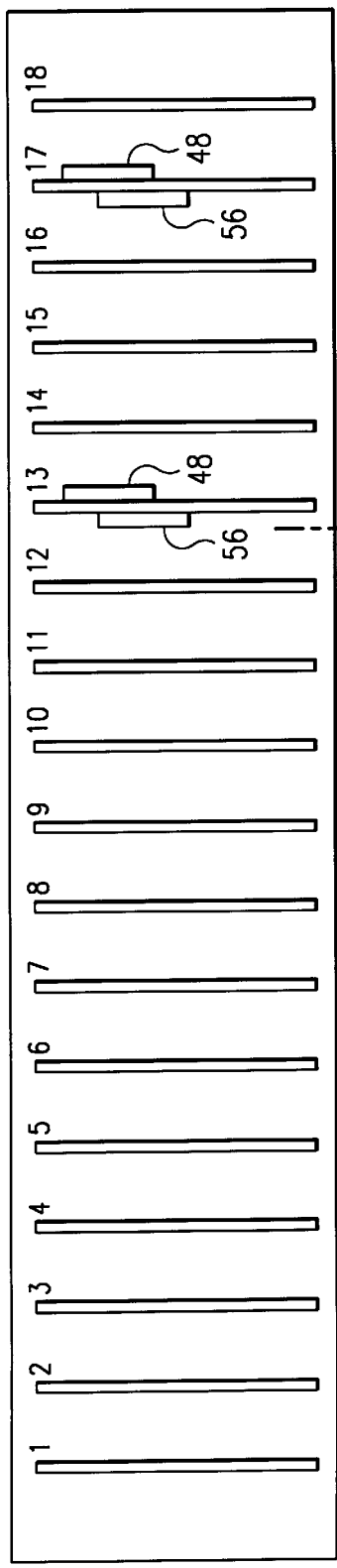
FIG. 8 depicts a top view of one embodiment of a redundant card cage.

FIG. 8 illustrates a top view of one embodiment of a redundant plane card cage 55. Card cage 55 has eighteen card slots that are adapted for coupling to cards, such as those illustrated in FIGS. 5 and 7, via redundant top and bottom planes. In the exemplary card cage 55, cards 1 and 2 are control cards that monitor and control the operation of the planes and the installed cards. Cards 3 to 16 are application cards that are assigned and perform various applications. Cards 17 and 18 are redundant cards that are capable of taking over applications for any card 1–16 that may fail or be taken out-of-service. Interface units, such as LIU 51, may link neighboring cards, such as cards 12 and 13, as described above with respect to LIU 50. LIU 51 is coupled to card 13 via connector 52 and to card 12 via connector 54. Connector 53 is used to link LIU 51 and cards 12 and 13 to signaling links or other information transfer links (not shown). Cards 13 and 17 may comprise a processor or ASIC 56 and a disk drive or memory device 48. Other features and components of cards 1–18 are not illustrated to simplify the figures.

Connectors 52 and 54 are connected on LIU 51 so that signals may pass between the connectors. When LIU 51 is coupled to cards 12 and 13, connector 52 provides a direct connection to ASIC 56 and connector 54 is coupled via a trace to the top and bottom connectors 30, 32 of card 12. Other connections between LIU 51 and cards 12 or 13 may exist, but are not discussed in detail herein. Signals received via connector 53 may travel to card 12 via connector 54 and then to connectors 30 and 32 via a trace on card 12. From connectors 30 and 32 the signals may enter the top and bottom planes and travel to other cards. Additionally, signals may be routed from connector 53 to processor 56 on card 13 via connector 52. Since connectors 52 and 54 are connected, signals may also travel from device 56 to the top and bottom planes via the route from ASIC 56 to connector 52 to connector 54 then via a trace to connectors 30 and 32 to the top and bottom planes. The trace connections on card 12 allow signals to flow from connector 54 to connectors 30 and 32, and then to the top and bottom planes, even if card 12 is not functioning.

In card cage 55, both cards 1–18 and the top and bottom planes provide redundant functionality. This allows applications to continue even if cards or planes fail. For example, if one or more applications are running on ASIC 56 of card 13, the applications can exchange signals and data with other systems via links coupled to LIU 51. If card 13 fails, control cards 1 or 2 will detect the failure and reassign card 13's applications to a redundant card, such as 17. ASIC 56 on card 17 will begin running the assigned applications. In a typical embodiment, cards 17 and 18 will not be coupled directly to LIUs, therefore, the signals for the application that are received via LIU 53 must be routed to card 17. This is accomplished as described above, the signals are routed via connectors 52 and 54 to card 12 and then via connectors 30 and/or 32 to the top or bottom plane. The active plane or planes then route the signals to redundant card 17. In this manner, card cage 55 continues to perform the applications without interruption.

Once the applications have been transferred from card 13 to card 17 and the signals have been rerouted to card 17, card 13 can be removed, repaired and/or replaced. When card 13 is removed, the signals from LIU 51 continued to be routed via card 12 to card 17 and the application continues to run. When card 13 is replaced, reset or brought back in service, control cards 1 and/or 2 again reassign the applications, this time moving them from card 17 back to card 13. Card 13 then resumes its assigned operations and card 17 is available to take over applications for any other card.

In the extremely unlikely event that two adjacent cards, such as 12 and 13 fail, the present system allows all applications to continue to run. In such a case, the applications from card 13 may be reassigned to card 17 as described above, and, similarly, the applications from card 12 may be reassigned to redundant card 18. Cards 12 and 13 are then removed, replaced, reset and/or repaired one at a time so that signals from LIU 51 to redundant card 17. Card 13 should be put back in service first, so that signals continue to flow from LIU 51 to card 17 via card 12. Once card 13 is back in service and running the application, then card 12 can be replaced, reset or repaired. When card 12 is removed, the signals that are initially routed to card 12 are received via a second LIU between cards 11 and 12 (not shown). These signals are rerouted to the application on redundant card 18 via the second LIU and card 11 in the same manner as described above for the rerouting of signals from card 13 to card 17.

In a preferred embodiment, the card cage contains the capability to perform Signaling System Seven (SS7)

functionality, such as Message Transfer Protocol (MTP) and Signaling Connection Control Part (SCCP) routing and network management functions required by a Signaling Transfer Point (STP) in an SS7 network. It may perform these functions for both the ANSI and ITU-T protocols. Additionally, other SS7/STP functionality may be provided such as, for example, Translation Type Mapping, Gateway Screening, and Cluster Routing and Management Diversity (CRMD). The card cage further contains the capability to perform Integrated Services Digital Network (ISDN) Primary Rate Interface (PRI) functionality as defined in the ITU-T recommendation Q.921. It will be understood that the card cage and cards disclosed herein are capable of providing any signaling protocol whether explicitly mentioned herein or not, including V.5 and X.25 protocols.

As described earlier, a 10/100 Mbps Ethernet interface may be supported on each card. These interfaces are independent and may be connected to separate LAN segments. Other protocols may be additionally supported such as TCP, UDP, ICMP, or FTP which uniquely positions the card cage for the convergence of Internet and telephony protocols at a carrier class level.

Also, a platform independent web browser interface may be available for system administration functions such as performance management, accounting management, security management, etc. The card cage may also provide the capability to be managed, in an ITU network, as a generic network element in accordance with the management principals defined in ITU standard M.3010, as well as the capability to provide viewing of the message signaling units that are processed through signaling links connected to the card cage.

Figure 9:
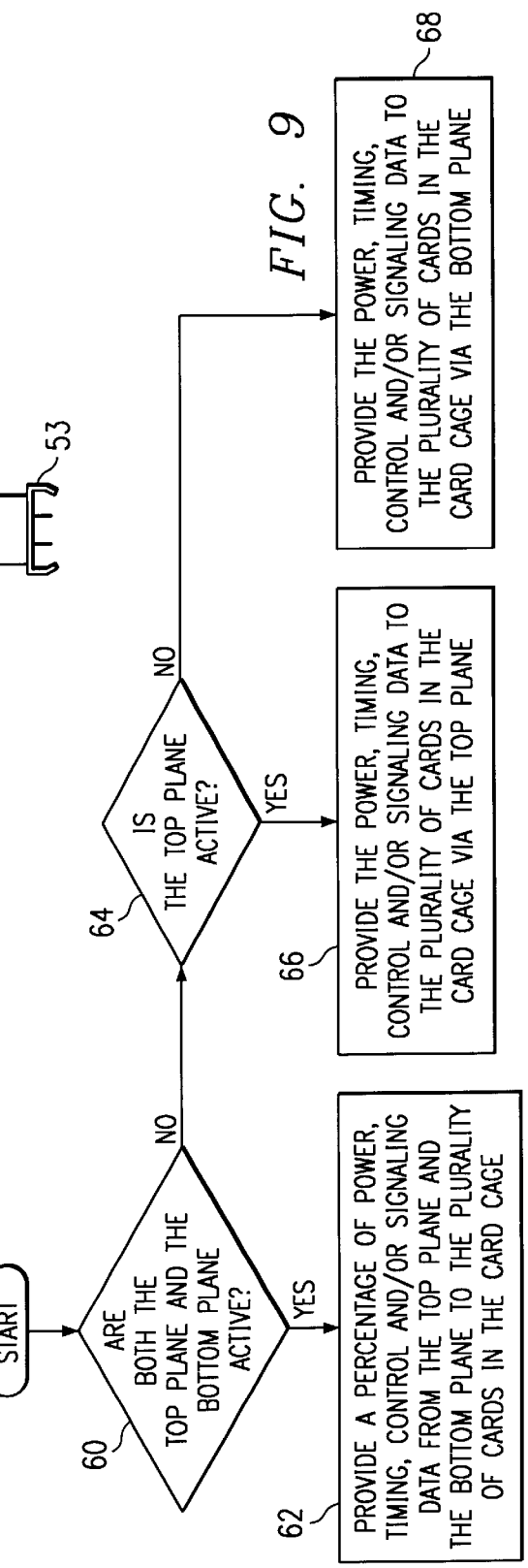
FIG. 9 depicts a flow chart that describes a method of information transfer for use with the present invention.

FIG. 9 is a flow diagram for a preferred embodiment of information transfer utilizing at least one of a plurality of cards contained in a card cage that includes a top plane and a bottom plane. The flow diagram begins at block 60 where the top plane and the bottom plane are checked to see if they are both active. If they are, the method proceeds to block 62 where a percentage of power, timing, control, and signaling data (i.e. information transfer) is provided from the top plane and the bottom plane to the plurality of cards in the card cage (i.e. operating in a load-sharing manner). If it is determined that both planes are not active at block 60, the flow proceeds to block 64 where the top plane is checked to see if it is active. If the top plane is active, the flow proceeds to block 66 where the power, timing, control, and signaling data is provided from the top plane to the plurality of cards in the card cage (i.e. operating in a redundancy manner). If the top plane is not active, the flow proceeds to block 68 where the power, timing, control, and signaling data is provided from the bottom plane to the plurality of cards in the card cage (i.e. operating in a redundancy manner).

The top and bottom planes of the preferred embodiment have been shown and described herein as being slidably connected to the card cage. However, it should be understood that in alternative embodiments the planes may be connected to the card cage in a variety of different ways, such as being screwed onto the cage, "snapped" into the cage, latched into the cage, rotatably connected or hinged to the card cage, or otherwise coupled to the card cage. Any such alternative embodiment is intended to be within the scope of the present invention.

It should also be understood that the number of slots or connectors shown and described herein may vary in alternative embodiments. As described herein, a preferred embodiment provides for 18 slots on each plane for receiving circuit cards. However, in alternative embodiments, a different number of slots (i.e., more than 18 or less than 18) may be provided for receiving circuit cards within a card cage, and any such alternative embodiments are intended to be within the scope of the present invention. Furthermore, the control cards, active application cards, or redundant cards may be positioned in any slot or location within the card cage.

It should also be understood that the connectors shown in the figures herein may, in alternative embodiments, be positioned differently than shown. That is, the connectors on circuit cards may be positioned differently on the card than illustrated herein. For example the connectors may be aligned near the right side of a circuit card, aligned near the left side of the circuit card, or aligned near the middle of the circuit card. Further, the connectors may be unaligned, such as having the top connector near the right side of the circuit card and the bottom connector near the left side of the circuit card. Additionally, the connectors of a circuit card may be a different size (e.g., have a different number of etched connections). Moreover, in alternative embodiments different types of connections may be used to couple a circuit card to a plane for the transfer of information. It should be understood that various embodiments of the circuit cards and the connectors provided on the dual redundant planes of a card cage are possible, and any embodiment that may be implemented in a way that allows circuit cards to couple to multiple planes within a card cage to allow the transfer of information to the circuit cards is intended to be within the scope of the present invention.

It should further be understood that the terms "top" and "bottom" used herein to refer to the planes within a card cage and the connectors on the circuit card have been used for reference purposes only. As described herein, a preferred embodiment provides a top and bottom plane of a card cage and corresponding top and bottom connectors on circuit cards to be received by the card cage. However, in alternative embodiments the planes and the connectors may be aligned in a variety of orientations. For example, in an alternative embodiment the planes may be aligned on the right and left sides of a card cage. In another alternative embodiment, the planes may be unaligned, such as one plane on the back of the card cage and one plane on the top of the card cage. In such an alternative embodiment, the connectors may be placed in a corresponding manner on the circuit cards, such that the circuit cards may be received by such a top and back plane arrangement. It should be understood that any such alternative embodiment is intended to be within the scope of the present invention.

It is thus believed that the operation and construction of the present invention will be apparent from the foregoing description. While the method, apparatus, and system shown and described has been characterized as being preferred, and although the present invention and its advantages have been described in detail, it will be readily apparent that various changes and modifications could be made therein without departing from the spirit and scope of the invention as defined in the following claims.

What is claimed is:

1. A card cage able to receive a plurality of cards, the card cage comprises:

a top surface, having a top plane, the top surface coupled to a first side portion, a second side portion, and a back portion;

a bottom surface, having a bottom plane, the bottom surface coupled to the first side portion, the second side portion, and the back portion, wherein the top and bottom planes are redundantly coupled to cards adapted to operate with the card cage; and a controller for monitoring the operation of the top and bottom planes and for controlling the transfer of information among the top and bottom planes and the cards.

2. The card cage of claim 1, wherein the planes provide power, timing, control, or signaling data information to the plurality of cards when the planes are active.

3. The card cage of claim 1, wherein an inactive plane may be removed and replaced without disrupting service to the plurality of cards.

4. The card cage of claim 1, wherein the plurality of cards operate in a redundant manner.

5. The card cage of claim 1, wherein an inactive card may be removed and replaced without disrupting service to the plurality of cards.

6. The card cage of claim 1, wherein the top plane comprises a first set of connectors and the bottom plane comprises a second set of connectors; and wherein said first set of connectors are adapted for coupling to a first edge connector of a circuit card and said second set of connectors are adapted for coupling to a second edge connector on the circuit card.

7. The card cage of claim 1, wherein the plurality of cards support communications applications and further comprise at least one interface selected from the group consisting of:

an Ethernet interface, a Small Computer System Interface (SCSI), a Firewire interface, and a Intelligent Drive Electronics (IDE) interface.

8. The card cage of claim 1 further comprising line interface units providing physical interfaces for each of plurality of installed cards.

9. The card cage of claim 1, wherein the top and bottom planes are capable of simultaneously providing signals to installed cards.

10. A device for coupling to a communications network as a network node comprising:

a card cage for holding a plurality of cards, said card cage having a first plane and a second plane, wherein said first and second planes are respectively coupled to first and second connectors on each of said cards;

said first plane and said second plane capable of providing information to said cards via said first and second connectors; and a controller for monitoring the operation of said first and second planes and of said cards and for controlling the transfer of information among said first and second planes and said cards.

11. The device of claim 10, wherein the planes provide power, timing, control, and signaling data information to the plurality of cards when they are active.

12. The device of claim 10, wherein an inactive plane may be removed and replaced without disrupting service to the plurality of cards.

13. The device of claim 10, wherein a set of the plurality of cards operate in a redundant manner.

14. The device of claim 10, wherein an inactive card may be removed and replaced without disrupting service to the plurality of cards.

15. The device of claim 10, wherein the first plane and the second plane respectively correspond to a top side and a bottom side of a card cage.

16. The device of claim 10, wherein the plurality of cards support communications applications and further comprise at least one interface selected from the group consisting of:

an Ethernet interface, a Small Computer System Interface (SCSI), a Firewire interface, and a Intelligent Drive Electronics (IDE) interface.

17. The device of claim 10 further comprises line interface units coupled to said cards and providing physical interfaces for each of the plurality of cards.

18. The device of claim 10, wherein the first and second planes operate in a redundant manner to provide uninterrupted information to said cards.

19. A method for transferring information utilizing a card cage comprising a first plane and a second plane, said card cage adapted to a plurality of cards so that said cards are electrically coupled to said first and second planes, the method comprising the steps of:

determining if the first plane is active;

determining if the second plane is active; and providing a first percentage of information to the plurality of cards via the first plane and a second percentage of information to the cards via the second plane.

20. The method of claim 19 wherein, if the second plane is inactive, the first percentage is 100 percent and the second percentage is zero.

21. The method of claim 19 wherein, if said second plane is capable of being active and said first percentage is 100 percent; and wherein said second plane is in a standby condition to provide 100 percent of said information if said first plane becomes inactive.

22. The method of claim 19, wherein the information comprises at least one type of information selected from the group consisting of:

power timing, control, and signaling data.

23. The method of claim 19 wherein, if the first plane and the second plane are both capable of being active, then the first percentage and the second percentage are both greater than zero.

24. A computer program product having a computer readable medium with computer program logic recorded thereon for use in a system for controlling the operation of a card cage having redundant planes, said computer program product comprising:

means for determining if a first plane is active;

means for determining if a second plane is active; and means for controlling a first percentage of information that is provided to installed cards via the first plane and for controlling a second percentage of information that is provided to the installed cards via the second plane.

25. A method of controlling the operation of a card cage having a first backplane and a second backplane, wherein a plurality of cards are adapted to function with the card cage by coupling to the first and second backplanes and by transferring information across said first and second backplanes, the method comprising:

monitoring the operation of the first and second backplanes;

monitoring the operation of the cards; and controlling the transfer of information among said first and second planes and said cards.

26. The method of claim 25 wherein the first and second backplanes are not on the same surface of the card cage.

* * * * *